United States Patent
Wei et al.

(10) Patent No.: US 9,455,726 B1
(45) Date of Patent: Sep. 27, 2016

(54) XOR (EXCLUSIVE OR) BASED TRIANGULAR MIXING FOR DIGITAL PHASE CONTROL

(71) Applicant: Intel Corporation, Santa Clara, CA (US)

(72) Inventors: Fangxing Wei, Folsom, CA (US); Michael J Allen, Folsom, CA (US); Khushal N Chandan, Folsom, CA (US); Setul M Shah, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/745,321

(22) Filed: Jun. 19, 2015

(51) Int. Cl.
| | |
|---|---|
| *H03K 3/00* | (2006.01) |
| *H03K 3/64* | (2006.01) |
| *H03K 3/78* | (2006.01) |
| *H03L 7/081* | (2006.01) |
| *H03K 19/21* | (2006.01) |

(52) U.S. Cl.
CPC ............ *H03L 7/0814* (2013.01); *H03K 19/21* (2013.01); *H03L 7/0818* (2013.01)

(58) Field of Classification Search
CPC ............ H03K 3/00; H03K 3/64; H03K 3/78
See application file for complete search history.

(56) References Cited

U.S. PATENT DOCUMENTS 7,282,971 B2 * 10/2007 Panpalia ............... H03L 7/095
                                                          327/149

* cited by examiner

*Primary Examiner* — Hai L Nguyen
(74) *Attorney, Agent, or Firm* — Compass IP Law PC (57) ABSTRACT

Phase compensation in an I/O (input/output) circuit includes a triangular control contour with a simplified generation circuit. A linear control circuit can generate a digital N-bit linear count, and route the least significant M bits [(M−1):0] for linear control for fine delay mixing of a phase compensation loop and the most significant (N−M) bits [(N−1):M] for linear control for coarse control of a delay chain for the phase compensation loop. Prior to decoding the least significant M bits for fine delay mixing, the control circuit performs a bitwise XOR (exclusive OR) of bit M with each of bits [(M−1):0] to generate M linear control bits as the linear control for fine delay mixing. The M linear control bits generate a linear control count having a triangular contour, where the linear control count continuously, repeatedly counts from 0 to $(2^M-1)$ to 0.

20 Claims, 7 Drawing Sheets

XOR (EXCLUSIVE OR) BASED TRIANGULAR MIXING FOR DIGITAL PHASE CONTROL

FIELD

Embodiments of the invention are generally related to digital input/output (I/O) circuits, and more particularly to a triangular control signal for a phase compensation loop.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Intel Corporation, All Rights Reserved.

BACKGROUND

Inter-device I/O (input/output) allows different system components to communicate to each other for operation of modern computing systems that find their use in any of a very wide array of consumer and commercial devices. Improvements in device operation and minimum geometry scaling have enabled devices to become more energy efficient. Consequently, inter-device I/O or inter-device communication or I/O is a significant factor in the power consumption of the operation of many electronic devices. To improve inter-device I/O power performance, many systems reduce the transfer of I/O clocks or timing signals between devices. To maintain adequate I/O error performance, various techniques can be used to provide phase compensation of the I/O signals.

One type of phase compensation (such as that used in certain double data rate (DDR) memory I/O delay locked loops (DLLs)) is a serial type of delay chain. A serial type delay chain first performs a coarse lock, and then performs a fine delay lock in series. Serial type delay chains cause switching jitter during DLL tracking or phase locking. The jitter introduced by serial delay chains can be reduced by use of a parallel type of delay chain. Parallel type delay chains perform fine delay mixing of the coarse locking. However, parallel type delay chains can still introduce jitter if the DLL delay chain coarse code and fine code are switched at the same time. Such jitter can be effectively removed by implementing triangular controlled fine delay mixing. However, traditional triangular control is generated by complex circuits and/or state machines. The complexity increases the amount of logic used. Known designs for triangular control include shift register circuits, which result in complicated logic control. Additionally, shift register circuits are known to introduce timing errors.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, phase compensation or phase control in an I/O (input/output) circuit includes a triangular control contour with a simplified generation circuit. A linear control circuit can generate a digital N-bit linear count, and route the least significant M bits [(M−1):0] for linear control for fine delay mixing of a phase compensation loop and the most significant (N−M) bits [(N−1):M] for linear control for coarse control of a delay chain for the phase compensation loop. Prior to decoding the least significant M bits for fine delay mixing, the control circuit performs a bitwise XOR (exclusive OR) of bit M with each of bits [(M−1):0] to generate M linear control bits as the linear control for fine delay mixing. The M linear control bits generate a linear control count having a triangular contour, where the linear control count continuously, repeatedly counts from 0 to $(2^M-1)$ to 0.

The phase control described herein includes a control signal with a triangular contour, which is generated with an XOR circuit. The XOR circuit is much simpler than shift register circuits, and does not introduce timing errors. Thus, a phase compensation signal for a parallel type delay chain can provide the desired control contour without the complexity and potential errors of previous designs. The phase compensation can be included in any DLL (delay locked loop) or PLL (phase locked loop) circuit used to provide phase compensation. The phase compensation can be implemented in an inter-device I/O (input/output), and is well suited for use in memory subsystems. In one specific example, the phase compensation can be implemented in DLLs for data I/O in memory devices.

The following descriptions use the example of data I/O in memory devices as a non-limiting illustration. In data I/O, especially on the data output from DRAM (dynamic random access memory) devices, the data can be exchanged and use an internal clock signal for reference. To use an internal clock signal to process the data, the system first aligns the data with the internal clock. For data output in DDR (double data rate) based DRAMs, use of the internal clock allows the receiving device to use the clock to receive the data, with an integral number of clock cycles.

A DLL or PLL can be employed to overcome power supply noise in the aligning or synchronizing of the data signal to the internal clock. In one embodiment, the system introduces delay compensation with a parallel delay chain, which includes a coarse code delay chain, and a fine code for fine delay mixing. The fine code generates the triangular control signal contour to provide for smooth changes in delay compensation that minimize the introduction of jitter. The XOR-based fine code control eliminates the need for a shift register. In one embodiment, the XOR-based compensation can include a simple binary counter, the XOR circuit, and a linear decoder. The binary counter can be a counter that continually increments the count, or a counter that continually decrements the count (i.e., an up/down counter).

In one embodiment, the output of the counter is separated by bits, with the upper portion of the bits used for the coarse code control, and the lower portion used for the fine delay mixing. The upper and lower portions are not necessarily the same number of bits, although they could be. In one embodiment, the XOR circuit performs a bitwise XOR operation of the LSB (least significant bit) of the coarse delay code to control the fine delay code. Thus, the XOR circuit can include multiple XOR gates. As described in more detail below, when the LSB of the coarse code is 0, the bitwise XOR operation will result in passing the lower portion of the count as it is, generating a fine code that counts up as the counter increments. It will be understood that when the fine code reaches its upper limit and overflows, the LSB of the coarse code will transition to 1 because the LSB of the coarse code is the overflow bit for the fine code. When the LSB of the coarse code is 1, the bitwise XOR operation will result in inverting the lower portion of the count, resulting in a fine code that starts at its peak value and decrements as the counter increments. It will be understood that the same result can be achieved by using a decrementing counter. Thus, the count from the counter can continue in the same direction the entire time, but will result in the fine code repeatedly, continuously counting from zero to its maximum, from its maximum to zero, and back up to its maximum.

Such a simple XOR based triangular DLL delay control has been observed to achieve glitch free delay code updates for DDR I/O. The XOR based phase control is simplified as compared to designs based on shift register controller. Additionally, such circuit simplification has been observed to provide reduced power consumption with respect to synchronizing I/O phase to the internal clock. Furthermore, the XOR based design provides simplicity in scaling the size of a DLL delay chain, as well as providing variable programmability to the fine delay tracking size (often referred to as "step size" in the industry).

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specifications. In addition to the I/O for memory devices, the phase compensation techniques can be applied to other inter-device communication where phase compensation can be used to align a command or data signal to a clock signal.

Figure 1:
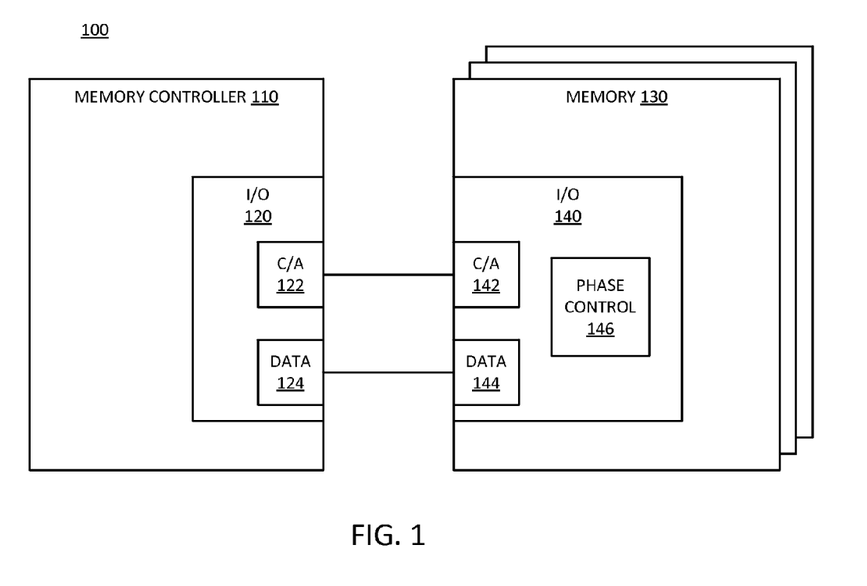
FIG. 1 is an embodiment of a block diagram of a system that applies phase control for an I/O signal exchanged between two devices.

FIG. 1 is an embodiment of a block diagram of a system that applies phase control for an I/O signal exchanged between two devices. System 100 provides one example of a memory subsystem in I/O phase control is provided with an XOR based circuit. Memory 130 represents memory resources in system 100. For example, each memory device can be a DRAM device. Memory 130 can be organized as channels, ranks, banks, DIMMs (dual inline memory modules), and/or other ways to manage the memory addressing and accessing.

Memory controller 110 represents a circuit or control logic to control access to memory 130. Memory controller 110 can be implemented as a discrete device, as a circuit that is part of a primary processor, or as a chip integrated into a system on a chip. In one embodiment, memory controller 110 is part of a central processing unit (not shown) that provides host processing control for a computing system in which system 100 is a part. There is commonly one memory controller per channel of memory; thus, there can be one or more independent memory controllers in a host system.

Memory controller 110 includes I/O 120 to communicate with chips or other devices external to the memory controller device. For example, memory controller 110 communicates with memory 130 via I/O 120. Memory 130 includes I/O 140 to connect to the signal lines that provide the electrical or signaling interface between memory controller 110 and memory 130. I/O 120 includes a command/address (C/A) interface 122 and a data interface 124. I/O 140 includes corresponding interfaces C/A 142 and data 144. The C/A interface enables memory controller 110 to provide commands and control signals to memory 130. The data interface enables memory controller 110 to send data to memory 130 for a write transaction, and for memory 130 to send data to memory controller for a read transaction. In one embodiment, memory controller 110 and memory 130 exchange data based on signals that need phase compensation to ensure proper signaling margining. In one embodiment, memory controller 110 includes phase control (not specifically shown). In one embodiment, memory 130 includes phase control 146.

In one embodiment, phase control 146 represents logic within memory 130 to provide phase adjustment to align an I/O signal (e.g., communication via data interface 144). In one embodiment, phase control 146 includes adjustment with respect to an internal clock (not specifically shown). The internal clock can be a clock signal received from the driving device, or the device providing a signal or timing signal. In one embodiment, phase control 146 includes logic within an internal controller of memory 130. In one embodiment, phase control 146 includes a delay locked loop, such as a digital delay locked loop (DLL) to provide phase compensation. Phase control 146 can adjust timing for noise and drift and other conditions that can cause an offset between the data edges and the clock edges. Phase control 146 can operate in accordance with any embodiment of phase control described herein.

Figure 2:
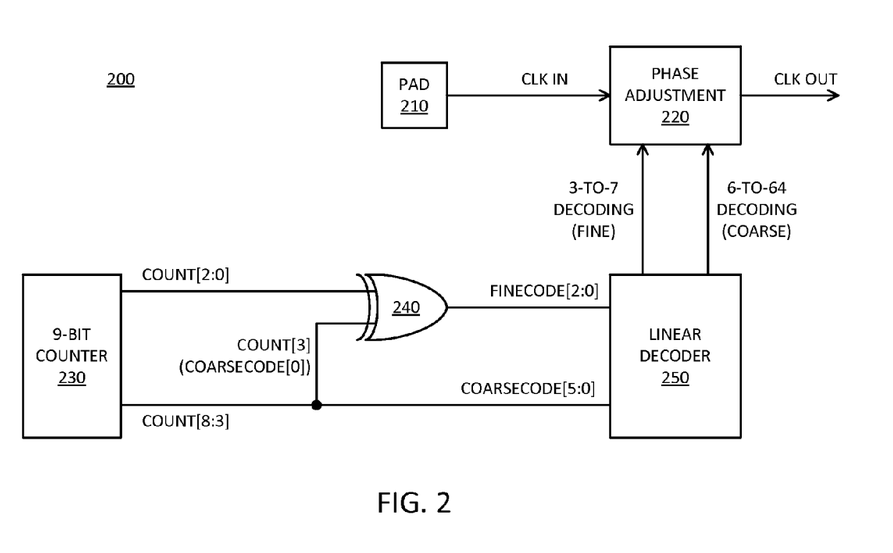
FIG. 2 is an embodiment of a block diagram of a system in which phase control includes coarse control and fine control that is XORed to generate a triangular control feature.

FIG. 2 is an embodiment of a block diagram of a system in which phase control includes coarse control and fine control that is XORed to generate a triangular control feature. In one embodiment, system 200 is one example of phase control for system 100. System 200 can provide phase control for a DLL or PLL for inter-device I/O. In one embodiment, system 200 receives a clock in signal (CLK IN) from pad 210. Pad 210 represents any type of physical connector to an external interface. In one embodiment CLK IN is an input clock signal received from the device sending a signal for processing (such as a data signal). Phase adjustment 220 represents logic and/or circuitry to provide one or more adjustments to the phase of the CLK IN signal to generate the clock out signal (CLK OUT). CLK OUT is phase adjusted to the data to time the sampling and signaling when the data signal is most likely to be processed correctly. In one embodiment, phase adjustment 220 represents multiple adjustment circuits, such as a coarse delay adjustment and a fine delay adjustment.

System 200 provides triangular delay control for at least some portion of phase adjustment 220. In one embodiment, system 200 provides triangular phase control for fine delay mixing. Counter 230 represents a simple, linear up/down counter. For purposes of example, counter 230 is illustrated specifically as a 9 bit counter, but could be any number of bits that will provide the control desired for the specific implementation of the phase control. As illustrated, part of the count from counter 230 is routed to control coarse phase adjustment, and part of the count is routed to control fine phase adjustment. It will be understood that reference to the "lower portion" of the count refers to the portion of the count that changes most frequently, or the least significant bits. The "upper portion" of the count refers to the other portion of the count, or the more significant bits.

System 200 routes the lower portion the counter output bits to control the fine delay mixing. As illustrated, in one embodiment, the upper six bits of the output of counter 230, count[8:3], are routed to control the coarse delay. Count[8:3] becomes coarsecode[5:0] as input for linear decoder 250. In one embodiment, coarsecode[5:0] provides control of a coarse delay chain even/odd output selection. It will be understood that a different number of bits can be used for fine delay mixing, depending on the design of the control system and the delay circuits. In one embodiment, linear decoder 250 performs a two-bit hot binary decode operation to select even/odd clocks out from a coarse delay chain that is part of phase adjustment 220.

In one embodiment, the lower three bits of the output of counter 230, count[2:0], are routed to control the fine delay mixing. The lower bits are not passed directly through for fine delay control. Rather, system 200 provides a bitwise XOR of count[2:0] with the LSB of the coarse delay control. It will be understood that the LSB of the coarse code delay control can be referred to as coarsecode[0], which is the same as count[3]. XOR circuit 240 performs the bitwise XOR operation and changes count[2:0] to finecode[2:0] or the fine delay code. In one embodiment, linear decoder 250 receives finecode[2:0] to control fine delay mixing in a phase interpolator unit of phase adjustment 220. It will be understood that linear decoder 250 can include more than one circuit, and does not necessarily perform the same decoding operation on the fine delay code and the coarse delay code. It will be understood that system 200 provides more direct control of the delay mixing based on the application of the XORed fine code delay bits, as contrasted to the indirect control traditionally applied through a complex state machine.

In one embodiment, decoder 250 generates fine delay mixing control as a 3-to-7 decoding. Thus, the three bits of finecode[2:0] are converted to 7 bits of control (for example, as explained below with respect to FIG. 5). In one embodiment, the fine delay control of system 200 as illustrated counts continuously from 0 to 7 to 0, in a repeated cycle. In binary, the count starts at '000xB' and counts up until it reaches '111xB', and then it counts from '111xB' back down to '000xB'. In one embodiment, decoder 250 generates 64 bits of coarse delay control from the six bits of coarsecode [5:0] (i.e., 6-to-64 decoding). It will be understood that the number of bits needed for coarse control depends on the length of the coarse delay chain, and chains of binary lengths other than 64 can be used.

Figure 3:
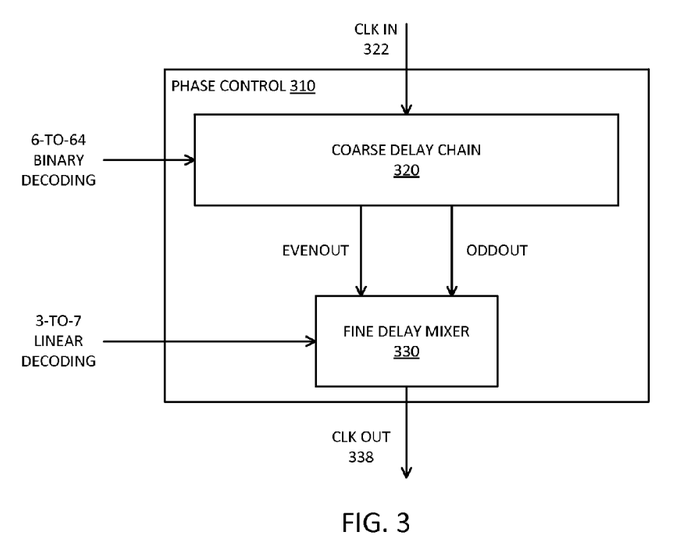
FIG. 3 is an embodiment of a block diagram of phase control having a coarse delay chain and a fine delay mixer to lock phase.

FIG. 3 is an embodiment of a block diagram of phase control having a coarse delay chain and a fine delay mixer to lock phase. Phase control 310 illustrates circuits for phase adjustment, such as that provided in system 200 of FIG. 2. Phase control 310 provides an example of a parallel type delay chain. Phase control 310 includes coarse delay chain 320. In one embodiment, coarse delay chain 320 outputs two phases of even/odd clocks. The phase difference is the coarse delay adjustment size, or the amount of phase adjustment per unit of coarse code count (often referred to as "step size").

Phase control 310 receives CLK IN 322 as an input to coarse delay chain 320. In one embodiment, coarse delay chain 320 is controlled by a 64 bit binary decoding from 6 bits of coarse code control. As the coarse code increases, the total coarse delay will accumulate. The coarse delay adjustment size is large enough to allow the coarse code to perform a coarse lock on the desired signal timing. However, the adjustment size can be configured to be too large for target I/O timing. For example, the phase differences generated by a 64 bits coarse delay chain will typically be too large to meet DDR I/O timing specifications, which are on the order of 150 ps under a slow PVT (process, voltage, temperature) corner. In one embodiment, phase control 310 provides fine delay mixing with fine delay mixer 330, we represents an interpolation type mixing structure that further divides the coarse phase adjustments into finer adjustments. The 7 bit linear decoding input provides 7 bits of control from 3 bits of fine delay code. The 7 bit linear decoding minimizes switching jitter by providing an XOR-based triangular control contour in accordance with any embodiment described herein.

In one embodiment, phase control 310 switches either coarse code or the fine code at one time, but not both. Switching either the coarse code or the fine code but not both can reduce switching jitter. In one embodiment, when phase control 310 is switching the coarse code for coarse delay chain 320, the un-switched clock phase from coarse delay chain 320 will be the clock output CLK OUT 338. The switched phase will transition momentarily, but the transition effect will be buried inside phase control 310 without being noticed from outside. A triangular control contour as described herein can provide the fine delay mixing control to help prevent the transition from being noticed external to phase control 310.

Figure 4:
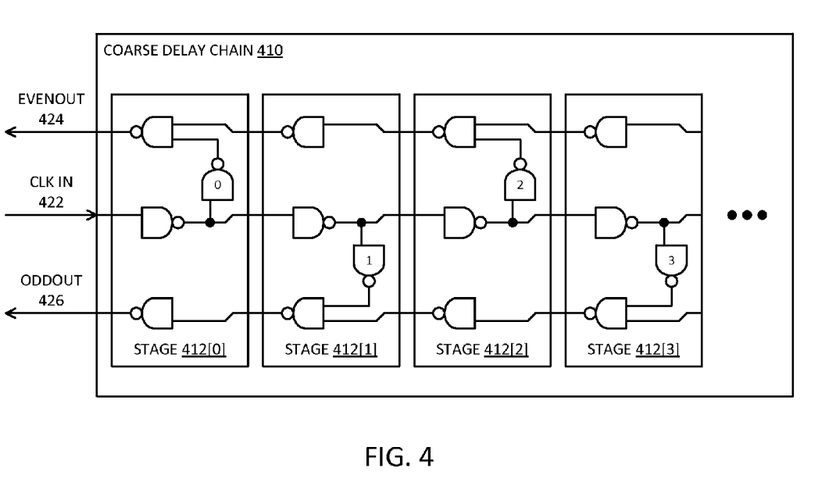
FIG. 4 is an embodiment of a block diagram of a coarse delay chain.

FIG. 4 is an embodiment of a block diagram of a coarse delay chain. Course delay chain 410 is one embodiment of an example of a coarse delay chain such as implemented in phase control 310 and/or for system 100 or system 200. Coarse delay chain 410 can be part of a parallel structure of delay compensation. CLK IN 422 represents the input clock that is being phase adjusted. Coarse delay chain 410 outputs two phases of even/odd clocks, as illustrated by EVENOUT 424 and ODDOUT 426. In one embodiment, the phase difference is the coarse delay adjustment size.

It will be understood that different coarse delay architectures could be used. As illustrated in coarse delay chain 410, the coarse delay adjustment size is a two NAND gate delay. Other delay circuits could provide a two phase delay, and other structures could provide the specific two NAND gate delay. Thus, coarse delay chain 410 is merely one example, and is not limiting. Coarse delay chain 410 illustrates the first four stages (stage 312[3:0]) of the delay chain. The delay chain can include any binary number (N bits) of delay stages. For instance, the example above assumes 64 stages, and known delay chain designs include 128 stages.

Figure 5:
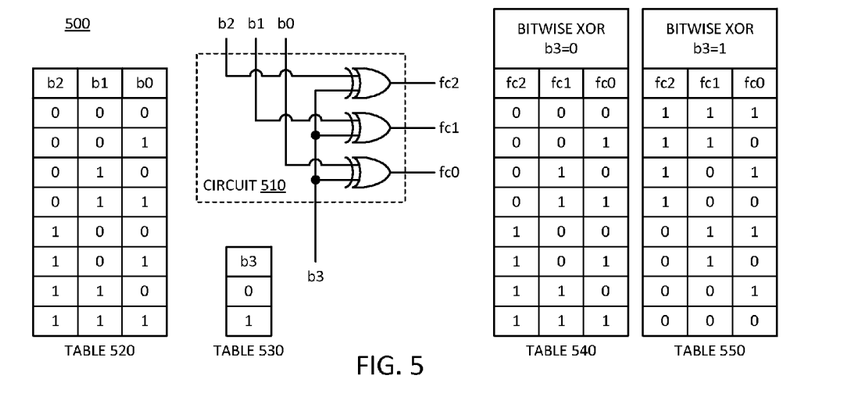
FIG. 5 is a representation of an embodiment of a truth table for linear control bits, where a direction of the fine delay mixing count is controlled by the LSB of the coarse control code.

FIG. 5 is a representation of an embodiment of a truth table for linear control bits, where a direction of the fine delay mixing count is controlled by the LSB of the coarse control code. Diagram 500 illustrates XOR circuit 510, which is simplified representation of a bitwise XOR circuit, with as many XOR gates as input bits. In the example, there are three gates. Bit b3 is XORed with each of bits b2, b1, and b0, to generate, respectively, fine control bits fc2, fc1, and fc0.

Table 520 represents the possible binary combinations for the three bits b2, b1, and b0. Assuming b2 to be the MSB (most significant bit) and b0 to be the LSB, the three bits counts up as follows: '000', '001', '010', . . . , '111'. Table 530 illustrates the possible binary states of bit b3, which is XORed with each of bits b2, b1, and b0. Table 540 illustrates the truth table for the binary states of fc2, fc1, and fc0 when b3=0. Table 550 illustrates the truth table for the binary states of fc2, fc1, and fc0 when b3=1.

It will be observed that when b3=0, the states of f2:f0 are identical to the states of b2:b0. Thus, the values in table 540 are identical to the values in table 520. But when b3=1, the states of f2:f0 are inverses of when b3=0. Thus, it will be observed in table 550 that everywhere a '0' appears in table 520 there is a '1' in table 550, and everywhere there is a '1' in table 520 there is a '0' in table 550. As a result, fc2:fc0 counts up in accordance with '000', '001', '010', . . . , '111' when b3=0, and counts down in accordance with '111', '110', '101', . . . , '000' when b3=1. It will be understood that the logic could be reversed depending on whether an incrementing or decrementing counter is used, and whether an XOR gate or a /XOR gate is used. But in each case the result will follow the same general pattern.

Figure 6:
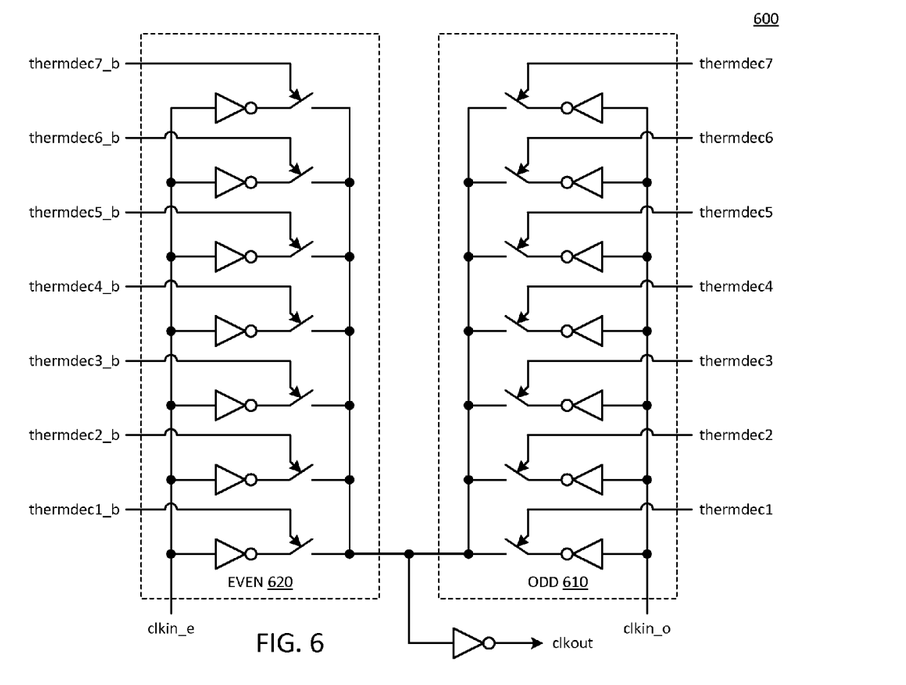
FIG. 6 is an embodiment of a block diagram of a fine delay mixer.

FIG. 6 is an embodiment of a block diagram of a fine delay mixer. Mixer 600 provides one example of an embodiment of fine delay mixing in accordance with mixer 330 of FIG. 3, and/or fine delay mixing for system 200 of FIG. 2 and system 100 of FIG. 1. Mixer 600 subdivides or cuts down each coarse phase adjustment into smaller adjustments. More specifically, the example of mixer 600 provides 7 sub-adjustments for each coarse adjustment amount. Thus, mixer 600 provides finer delay adjustments than the coarse delay chain. It will be understood that more or fewer subdivisions could be provided by mixer 600. With more subdivisions, the number of fine code bits would need to be increased, and fewer bits could be used if fewer subdivisions are desired.

In operation, the even and odd clocks are offset from each other. The signals clkin_e and clkin_o (clock in even and clock in odd) represent the offset clocks from the coarse delay chain. The signals thermdec[7:1] represent the output of the linear decoder based on the input of the fine delay mixing code. The signal clkin_o is fed into seven inverters in odd driver 610. The seven inverters in the odd driver are controlled, respectively, by being selectively switched based on the bit value of each bit of thermdec[7:1]. The signal clkin_e is fed into seven inverters in the even driver 620. The seven inverters in the even driver are controlled, respectively, by being selectively switched based on the bit value of the inverse of thermdec[7:1], represented as thermdec7_b, thermdec6_b, . . . , thermdec1_b.

Thus, depending on whether the fine delay code itself or the inverse of the fine delay code has more '1' bits, the inverted output clkout will "pull" further to the even phase of the coarse delay or further to the odd phase of the coarse delay. Effectively, the fine delay code shifts the actual clock output toward one or the other to sweep across the coarse delay range as the fine delay code changes. It will be understood that the fine delay will sweep across and back smoothly due to the XORed fine code signal. Thus, the circuit is expected to introduce minimal jitter.

It will be understood that a practical delay loop implementation will include a feedback mechanism, and include at least one stored value. Thus, once the system finds a good phase match (based on error detected from feedback), the system will stay at the coarse code and fine code setting that produced the phase match. In one embodiment, the system persists the code value until feedback determines that the signal has drifted, and again allows sweeping the phase delay to find a better match. The system can then begin at the saved value and sweep up or down, depending on detected conditions.

Figure 7:
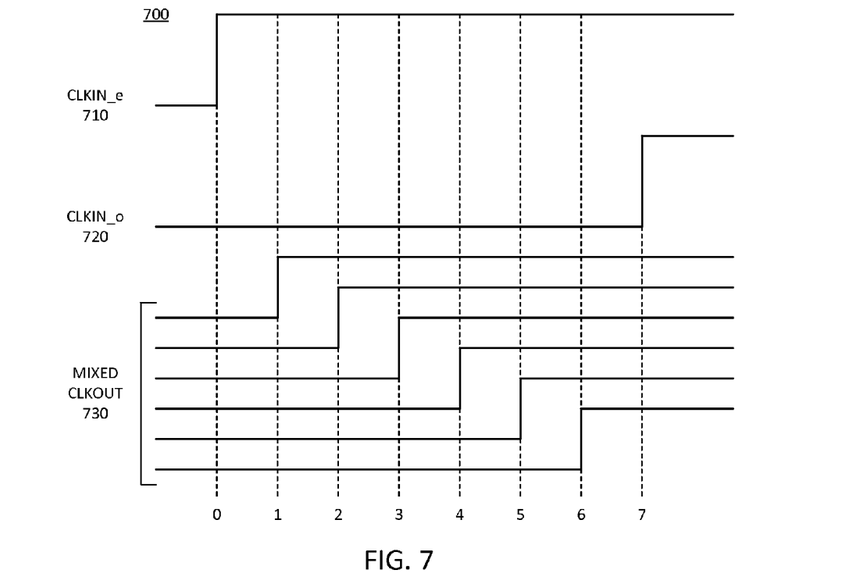
FIG. 7 is a diagrammatic representation of phase compensation timing generated by a fine delay mixer driven by XORed control bits.

FIG. 7 is a diagrammatic representation of phase compensation timing generated by a fine delay mixer driven by XORed control bits. Diagram 700 illustrates the clock phase shifting generated by fine delay mixing such as produced by mixer 600. Signal 710 represents the clock in with even phase delay, CLKIN_e. Signal 720 represents the clock in with odd phase delay, CLKIN_o. It will be understood that the even and odd clock in signals are generated by a coarse delay chain. It will be understood that the signaling for diagram 700 triggers on the rising edge, which is why the rising edges are illustrated for signals 710 and 720. A similar circuit could be constructed to trigger on the falling edges.

Mixed CLKOUT signal 730 represents the actual clock out signal that will be generated, depending on how the fine delay mixer drives the output signal closer to CLKIN_e or CLKIN_o. The fine delay mixer drives the output signal one direction or the other as it sweeps across the phase difference between CLKIN_e and CLKIN_o, based on the fine delay code. The numbers below the signal diagrams (shown aligned to the dashed lines) represent the value of the fine delay code. Thus, when the fine delay code is '000xb', the CLKOUT signal will be CLKIN_e. As the code increases, the output signal shifts towards the CLKIN_o signal, until a fine delay code of '111xb' outputs CLKIN_o as CLKOUT.

Figure 8:
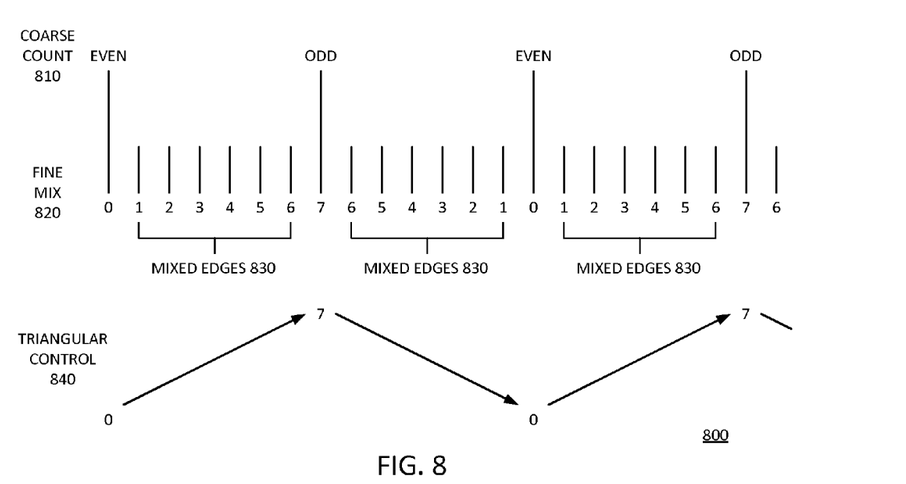
FIG. 8 is a diagrammatic representation of a triangular feature of fine delay phase compensation code generated by a fine delay mixer driven by XORed control bits.

FIG. 8 is a diagrammatic representation of a triangular feature of fine delay phase compensation code generated by a fine delay mixer driven by XORed control bits. Diagram 800 represents one embodiment of an example in accordance with diagram 700 of FIG. 7, but extended over multiple phases of the input clock.

Signal line 810 represents the coarse count. It will be understood that the coarse count can continue to increment or decrement depending on how many bits are used to represent the coarse code. Regardless of how many bits are used, for purposes of controlling the fine delay mixing by XORing the LSB of the coarse code with the fine code seed, the determinative factor is whether the coarse code is even or odd. Thus, rather than showing a value, signal line 810 is concerned only with the even or odd nature of the coarse count.

In one embodiment, when the coarse count is even (the LSB is '0'), the fine mix code shown in signal line 820 increments from 0 to 7. Triangular control 840 graphically represents the triangular contour that results. In one embodiment, when the coarse count is odd (the LSB is '1'), the fine mix code decrements from 7 to 0, even as the counter count used as the fine code seed increments from 0 to 7. Thus, as seen in signal line 840, the triangular control goes from 7 to 0. Mixed edges 830 illustrate a relative position of the output between the even and odd coarse clock edges as the fine delay code changes.

Thus, an XOR based triangular fine mixing can control the fine delay code of a DLL with the LSB of the coarse delay code for the DLL. The DLL can include XOR gates to generate the fine delay code based on the counter output and the coarse code LSB. Then when the LSB of the coarse code is '0', the XOR will pass the counter output as is to control the fine delay mixing. When fine code reaches its top limit and overflows, the LSB of coarse code becomes '1'. When the LSB of the coarse code is '1', as the counter output fine code portion again increments from '0' up to the maximum, the XOR gates invert the output, generating control code that goes from the maximum or upper limit value down to zero. When the fine code portion of the counter output again reaches its upper limit and overflows, the LSB of the coarse code will transition back to a '0', and pass the counter output through as is for the fine delay control. Thus, the system will repeatedly, continuously generate a fine delay code that increments from 0 to the maximum ($2^M-1$), where M is the number of fine code bits, back down to 0, and back up to ($2^M-1$). Each count of the fine delay code represents a subdivision of the coarse phase delay compensation amount.

Figure 9:
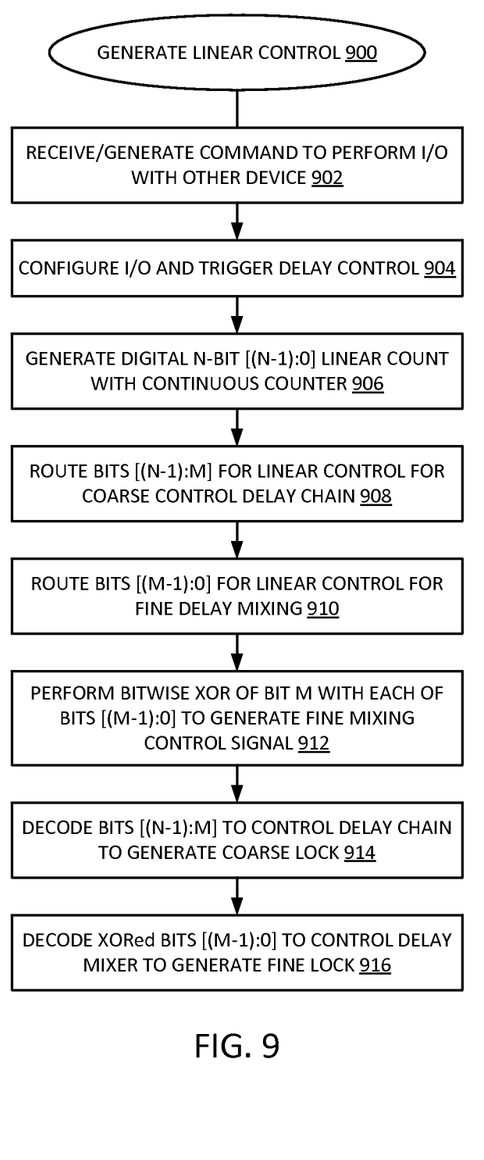
FIG. 9 is a flow diagram of an embodiment of a process for generating linear phase control.

FIG. 9 is a flow diagram of an embodiment of a process for generating linear phase control. Process 900 provides an example of an embodiment of generating linear phase control with an XOR based circuit. In one embodiment, a device either receives or generates a command to perform I/O with another device, 902. The I/O can be receiving an input signal or generating an output signal. The device includes an I/O control circuit, such as a microcontroller that manages the I/O. The controller configures the I/O for exchanging with the other device. In one embodiment, configuring the I/O include triggering delay control to adjust the phase of the I/O signal to align with a clock signal, 904.

The delay control circuit includes linear control to generate phase compensation adjustments. In one embodiment, the delay control generates a digital N-bit linear count with a linear counter, 906. The counter can be a continuous counter, such as an incrementing counter. The generated linear count will include bits [(N−1):0]. In one embodiment, the delay control logic routes the most significant (N−M) bits [(N−1):M] for linear control for coarse control of a delay chain for a phase compensation loop, 908. The phase compensation loop can be or include a DLL or PLL, and can include both coarse delay compensation and fine delay compensation, in a parallel configuration. In one embodiment, the delay control logic routes the least significant M bits [(M−1):0] of the N-bit count for linear control for fine delay mixing of the phase compensation loop, 910.

In one embodiment, the phase control routes the least significant M bits to an XOR circuit prior to routing the bits to a linear decoder that directly provides control bits to the fine delay mixing circuit. Thus, the phase control can perform a bitwise XOR of bit M (the LSB of the coarse code) with each of bits [(M−1):0] to generate M linear control bits as the linear control for fine delay mixing, 912. The M linear control bits will provide a linear control count having a triangular contour, where the linear control count repeatedly, continuously counts from 0 to ($2^M-1$) to 0, which will control the fine delay mixing. The delay control includes a decoder to decode bits [(N−1):M] to control the delay chain to perform a coarse lock, 914. The delay control also decodes the XORed [(M−1):0] bits to perform fine locking, 916.

Figure 10:
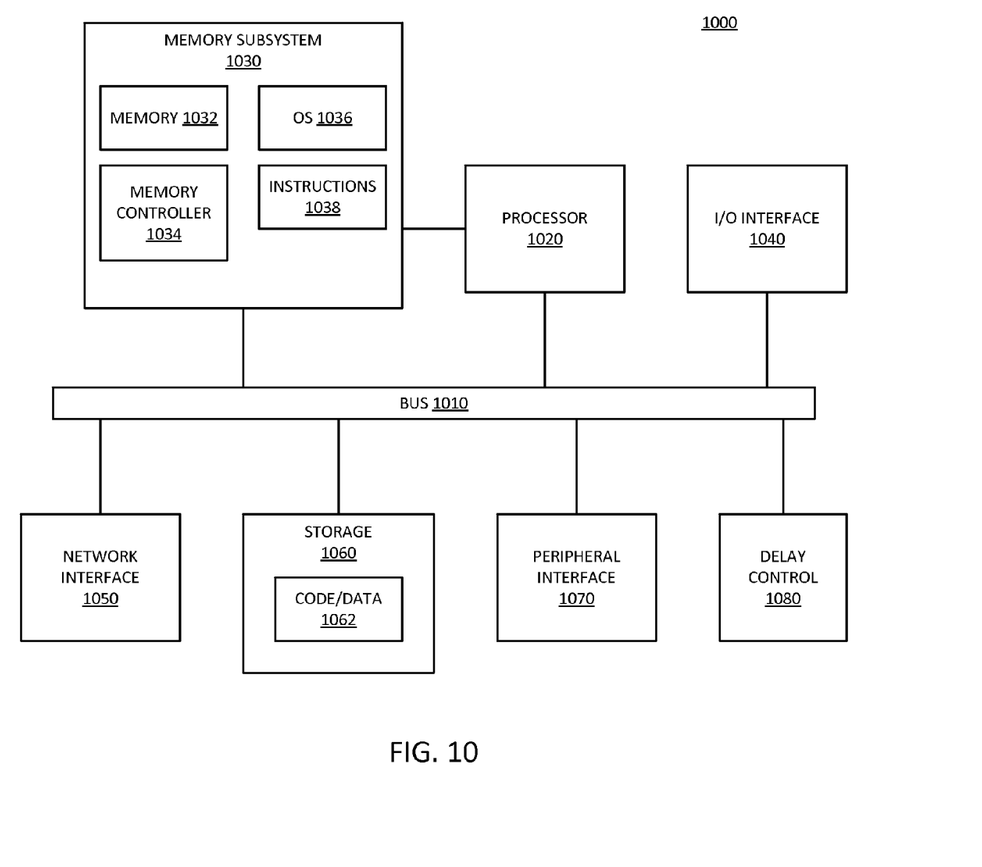
FIG. 10 is a block diagram of an embodiment of a computing system in which XORed linear phase control for I/O can be implemented.

FIG. 10 is a block diagram of an embodiment of a computing system in which XORed linear phase control for I/O can be implemented. System 1000 represents a computing device in accordance with any embodiment described herein, and can be a laptop computer, a desktop computer, a server, a gaming or entertainment control system, a scanner, copier, printer, routing or switching device, or other electronic device. System 1000 includes processor 1020, which provides processing, operation management, and execution of instructions for system 1000. Processor 1020 can include any type of microprocessor, central processing unit (CPU), processing core, or other processing hardware to provide processing for system 1000. Processor 1020 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 1030 represents the main memory of system 1000, and provides temporary storage for code to be executed by processor 1020, or data values to be used in executing a routine. Memory subsystem 1030 can include one or more memory devices such as read-only memory (ROM), flash memory, one or more varieties of random access memory (RAM), or other memory devices, or a combination of such devices. Memory subsystem 1030 stores and hosts, among other things, operating system (OS) 1036 to provide a software platform for execution of instructions in system 1000. Additionally, other instructions 1038 are stored and executed from memory subsystem 1030 to provide the logic and the processing of system 1000. OS 1036 and instructions 1038 are executed by processor 1020. Memory subsystem 1030 includes memory device 1032 where it stores data, instructions, programs, or other items.

In one embodiment, memory subsystem includes memory controller 1034, which is a memory controller to generate and issue commands to memory device 1032. It will be understood that memory controller 1034 could be a physical part of processor 1020.

Processor 1020 and memory subsystem 1030 are coupled to bus/bus system 1010. Bus 1010 is an abstraction that represents any one or more separate physical buses, communication lines/interfaces, and/or point-to-point connections, connected by appropriate bridges, adapters, and/or controllers. Therefore, bus 1010 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 1010 can also correspond to interfaces in network interface 1050.

System 1000 also includes one or more input/output (I/O) interface(s) 1040, network interface 1050, one or more internal mass storage device(s) 1060, and peripheral interface 1070 coupled to bus 1010. I/O interface 1040 can include one or more interface components through which a user interacts with system 1000 (e.g., video, audio, and/or alphanumeric interfacing). Network interface 1050 provides system 1000 the ability to communicate with remote devices (e.g., servers, other computing devices) over one or more networks. Network interface 1050 can include an Ethernet adapter, wireless interconnection components, USB (universal serial bus), or other wired or wireless standards-based or proprietary interfaces.

Storage 1060 can be or include any conventional medium for storing large amounts of data in a nonvolatile manner, such as one or more magnetic, solid state, or optical based disks, or a combination. Storage 1060 holds code or instructions and data 1062 in a persistent state (i.e., the value is retained despite interruption of power to system 1000). Storage 1060 can be generically considered to be a "memory," although memory 1030 is the executing or operating memory to provide instructions to processor 1020. Whereas storage 1060 is nonvolatile, memory 1030 can include volatile memory (i.e., the value or state of the data is indeterminate if power is interrupted to system 1000).

Peripheral interface 1070 can include any hardware interface not specifically mentioned above. Peripherals refer generally to devices that connect dependently to system 1000. A dependent connection is one where system 1000 provides the software and/or hardware platform on which operation executes, and with which a user interacts.

In one embodiment, system 1000 includes phase control 1080. Phase control 1080 can be included in an I/O phase compensation circuit to lock I/O with a clock signal, such as in memory subsystem 1030. Phase control 1080 includes parallel-type phase compensation with a coarse delay chain and fine delay mixing. The fine delay mixing subdivides the coarse phase compensation adjustments into smaller adjustments. The fine delay mixing is controlled by a fine delay code that is decoded by a linear decoder within phase control 1080. The fine delay code has a triangular contour due to XORing a linear count with the LSB of a coarse code that controls the coarse delay chain. When the LSB of the coarse code is even, the fine delay code counts up in accordance with the linear count it is based on. When the LSB of the coarse code is odd, the fine delay code counts down from its maximum as the linear count it is based on continues to increment. It will be understood that a similar result could be achieved with a decrementing counter.

Figure 11:
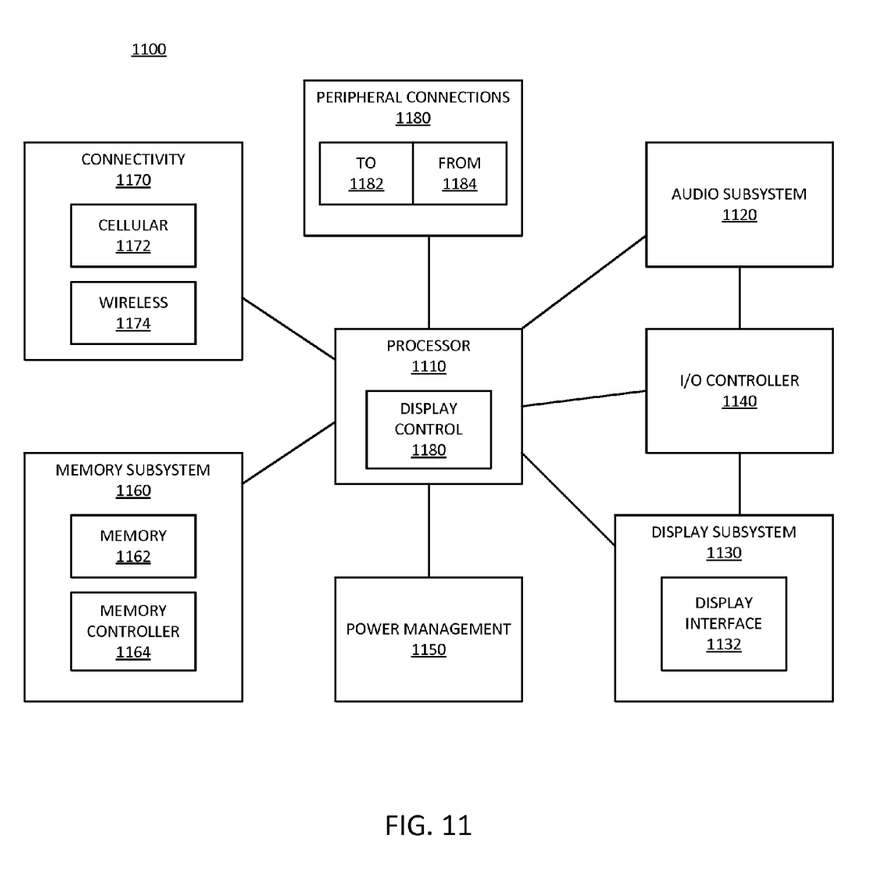
FIG. 11 is a block diagram of an embodiment of a mobile device in which XORed linear phase control for I/O can be implemented.

FIG. 11 is a block diagram of an embodiment of a mobile device in which XORed linear phase control for I/O can be implemented. Device 1100 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 1100.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and/or device functions are executed. The processing operations include operations related to I/O (input/output) with a human user or with other devices, operations related to power management, and/or operations related to connecting device 1100 to another device. The processing operations can also include operations related to audio I/O and/or display I/O.

In one embodiment, device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1100, or connected to device 1100. In one embodiment, a user interacts with device 1100 by providing audio commands that are received and processed by processor 1110.

Display subsystem 1130 represents hardware (e.g., display devices) and software (e.g., drivers) components that provide a visual and/or tactile display for a user to interact with the computing device. Display subsystem 1130 includes display interface 1132, which includes the particular screen or hardware device used to provide a display to a user. In one embodiment, display interface 1132 includes logic separate from processor 1110 to perform at least some processing related to the display. In one embodiment, display subsystem 1130 includes a touchscreen device that provides both output and input to a user. In one embodiment, display subsystem 1130 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 1140 represents hardware devices and software components related to interaction with a user. I/O controller 1140 can operate to manage hardware that is part of audio subsystem 1120 and/or display subsystem 1130. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one embodiment, I/O controller 1140 manages devices such as accelerometers, cameras, light sensors or other environmental sensors, gyroscopes, global positioning system (GPS), or other hardware that can be included in device 1100. The input can be part of direct user interaction, as well as providing environmental input to the system to influence its operations (such as filtering for noise, adjusting displays for brightness detection, applying a flash for a camera, or other features). In one embodiment, device 1100 includes power management 1150 that manages battery power usage, charging of the battery, and features related to power saving operation.

Memory subsystem 1160 includes memory device(s) 1162 for storing information in device 1100. Memory subsystem 1160 can include nonvolatile (state does not change if power to the memory device is interrupted) and/or volatile (state is indeterminate if power to the memory device is interrupted) memory devices. Memory 1160 can store application data, user data, music, photos, documents, or other data, as well as system data (whether long-term or temporary) related to the execution of the applications and functions of system 1100. In one embodiment, memory subsystem 1160 includes memory controller 1164 (which could also be considered part of the control of system 1100, and could potentially be considered part of processor 1110). Memory controller 1164 includes a scheduler to generate and issue commands to memory device 1162.

Connectivity 1170 includes hardware devices (e.g., wireless and/or wired connectors and communication hardware) and software components (e.g., drivers, protocol stacks) to enable device 1100 to communicate with external devices. The external device could be separate devices, such as other computing devices, wireless access points or base stations, as well as peripherals such as headsets, printers, or other devices.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading and/or uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 1100 includes phase control 1190. Phase control 1190 can be included in an I/O phase compensation circuit to lock I/O with a clock signal, such as in memory subsystem 1160. Phase control 1190 includes parallel-type phase compensation with a coarse delay chain and fine delay mixing. The fine delay mixing subdivides the coarse phase compensation adjustments into smaller adjustments. The fine delay mixing is controlled by a fine delay code that is decoded by a linear decoder within phase control 1190. The fine delay code has a triangular contour due to XORing a linear count with the LSB of a coarse code that controls the coarse delay chain. When the LSB of the coarse code is even, the fine delay code counts up in accordance with the linear count it is based on. When the LSB of the coarse code is odd, the fine delay code counts down from its maximum as the linear count it is based on continues to increment. It will be understood that a similar result could be achieved with a decrementing counter.

In one aspect, a method for a linear control circuit includes: generating a digital N-bit linear count; routing the least significant M bits [(M−1):0] for linear control for fine delay mixing of a phase compensation loop; routing the most significant (N−M) bits [(N−1):M] for linear control for coarse control of a delay chain for the phase compensation loop; and performing a bitwise XOR (exclusive OR) of bit M with each of bits [(M−1):0] to generate M linear control bits as the linear control for fine delay mixing, the M linear control bits to generate a linear control count having a triangular contour, where the linear control count repeatedly, continuously counts from 0 to (2M−1) to 0.

In one embodiment, generating the N-bit linear count comprises generating the count with a unidirectional counter. In one embodiment, N is 9. In one embodiment, M is 3. In one embodiment, the phase compensation loop comprises a digital delay locked loop (DLL). In one embodiment, the phase compensation loop comprises a phase locked loop (PLL). In one embodiment, the phase compensation loop comprises a loop to lock to an I/O (input/output) clock signal. In one embodiment, the phase compensation loop comprises a compensation loop for data I/O for a memory device. In one embodiment, the fine delay mixing subdivides each coarse phase change of the coarse control into (2M−1) fine delay phase changes.

In one aspect, an I/O (input/output) control circuit includes: a linear counter having an N-bit digital output; XOR (exclusive OR) logic to perform a bitwise XOR of bit M of the N bits with each of the least significant M bits [(M−1):0] of the N bits; and a linear decoder to decode the N bits for a phase compensation loop, wherein the linear decoder is to receive the least significant M bits from the XOR logic and generate fine delay mixing for the phase compensation loop from the least significant M bits, and wherein the linear decoder is to receive the most significant (N−M) bits [(N−1):M] and generate coarse control of a delay chain for the phase compensation loop from the most significant (N−M) bits; wherein for the fine delay mixing, the linear decoder is to generate a linear control count having a triangular contour, where the linear control count repeatedly, continuously counts from 0 to (2M−1) to 0.

In one embodiment, the N-bit linear counter comprises a unidirectional counter. In one embodiment, N is 9 and M is 3. In one embodiment, the phase compensation loop comprises a digital delay locked loop (DLL). In one embodiment, the phase compensation loop comprises a compensation loop to lock to an I/O (input/output) clock signal. In one embodiment, the phase compensation loop comprises a compensation loop for data I/O for a memory device. In one embodiment, the fine delay mixing subdivides each coarse phase change of the coarse control into (2M−1) fine delay phase changes.

In one aspect, a system with a memory subsystem with I/O (input/output) phase compensation includes: an I/O (input/output) control circuit for a data interface between a memory controller and a memory device, comprising: a linear counter having an N-bit digital output; XOR (exclusive OR) logic to perform a bitwise XOR of bit M of the N bits with each of the least significant M bits [(M−1):0] of the N bits; and a linear decoder to decode the N bits for a phase compensation loop, wherein the linear decoder is to receive the least significant M bits from the XOR logic and generate fine delay mixing for the phase compensation loop from the least significant M bits, and wherein the linear decoder is to receive the most significant (N−M) bits [(N−1):M] and generate coarse control of a delay chain for the phase compensation loop from the most significant (N−M) bits; wherein for the fine delay mixing, the linear decoder is to generate a linear control count having a triangular contour, where the linear control count repeatedly, continuously counts from 0 to (2M−1) to 0; and a touchscreen display coupled to generate a display based on data accessed from the memory device.

In one embodiment, the N-bit linear counter comprises a unidirectional counter. In one embodiment, N is 9 and M is 3. In one embodiment, the phase compensation loop comprises a digital delay locked loop (DLL). In one embodiment, the phase compensation loop comprises a compensation loop to an I/O (input/output) clock signal. In one embodiment, the phase compensation loop comprises a compensation loop for data I/O for a memory device. In one embodiment, the fine delay mixing subdivides each coarse phase change of the coarse control into (2M−1) fine delay phase changes.

In one aspect, an apparatus for controlling I/O (input/output) includes: means for generating a digital N-bit linear count; means for routing the least significant M bits [(M−1):0] for linear control for fine delay mixing of a phase compensation loop; means for routing the most significant (N−M) bits [(N−1):M] for linear control for coarse control of a delay chain for the phase compensation loop; and means for performing a bitwise XOR (exclusive OR) of bit M with each of bits [(M−1):0] to generate M linear control bits as the linear control for fine delay mixing, the M linear control bits to generate a linear control count having a triangular contour, where the linear control count repeatedly, continuously counts from 0 to (2M−1) to 0.

In one embodiment, the means for generating the N-bit linear count comprises means for generating the count with a unidirectional counter. In one embodiment, N is 9. In one embodiment, M is 3. In one embodiment, the phase compensation loop comprises a digital delay locked loop (DLL). In one embodiment, the phase compensation loop comprises a phase locked loop (PLL). In one embodiment, the phase compensation loop comprises a loop to lock to an I/O (input/output) clock signal. In one embodiment, the phase compensation loop comprises a compensation loop for data I/O for a memory device. In one embodiment, the fine delay mixing subdivides each coarse phase change of the coarse control into (2M−1) fine delay phase changes.

In one aspect, an article of manufacture comprising a computer readable storage medium having content stored thereon, which when accessed causes a machine to perform operations for controlling I/O (input/output), including: generating a digital N-bit linear count; routing the least significant M bits [(M−1):0] for linear control for fine delay mixing of a phase compensation loop; routing the most significant (N−M) bits [(N−1):M] for linear control for coarse control of a delay chain for the phase compensation loop; and performing a bitwise XOR (exclusive OR) of bit M with each of bits [(M−1):0] to generate M linear control bits as the linear control for fine delay mixing, the M linear control bits to generate a linear control count having a triangular contour, where the linear control count repeatedly, continuously counts from 0 to (2M−1) to 0.

In one embodiment, the content for generating the N-bit linear count comprises content for generating the count with a unidirectional counter. In one embodiment, N is 9. In one embodiment, M is 3. In one embodiment, the phase compensation loop comprises a digital delay locked loop (DLL). In one embodiment, the phase compensation loop comprises a phase locked loop (PLL). In one embodiment, the phase compensation loop comprises a loop to lock to an I/O (input/output) clock signal. In one embodiment, the phase compensation loop comprises a compensation loop for data I/O for a memory device. In one embodiment, the fine delay mixing subdivides each coarse phase change of the coarse control into (2M−1) fine delay phase changes.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/nonrecordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for a linear control circuit, comprising:
generating a digital N-bit linear count;
routing the least significant M bits [(M−1):0] for linear control for fine delay mixing of a phase compensation loop;
routing the most significant (N−M) bits [(N−1):M] for linear control for coarse control of a delay chain for the phase compensation loop; and
performing a bitwise XOR (exclusive OR) of bit M with each of bits [(M−1):0] to generate M linear control bits as the linear control for fine delay mixing, the M linear control bits to generate a linear control count having a triangular contour, where the linear control count repeatedly, continuously counts from 0 to $(2^M-1)$ to 0.

2. The method of claim 1, wherein generating the N-bit linear count comprises generating the count with a unidirectional counter.

3. The method of claim 1, wherein N is 9.

4. The method of claim 1, wherein M is 3.

5. The method of claim 1, wherein the phase compensation loop comprises a digital delay locked loop (DLL).

6. The method of claim 1, wherein the phase compensation loop comprises a loop to lock to an I/O (input/output) clock signal.

7. The method of claim 6, wherein the phase compensation loop comprises a compensation loop for data I/O for a memory device.

8. The method of claim 1, wherein the fine delay mixing subdivides each coarse phase change of the coarse control into $(2^M-1)$ fine delay phase changes.

9. An I/O (input/output) control circuit, comprising:
a linear counter having an N-bit digital output;
XOR (exclusive OR) logic to perform a bitwise XOR of bit M of the N bits with each of the least significant M bits [(M−1):0] of the N bits; and
a linear decoder to decode the N bits for a phase compensation loop, wherein the linear decoder is to receive the least significant M bits from the XOR logic and generate fine delay mixing for the phase compensation loop from the least significant M bits, and wherein the linear decoder is to receive the most significant (N−M) bits [(N−1):M] and generate coarse control of a delay chain for the phase compensation loop from the most significant (N−M) bits;
wherein for the fine delay mixing, the linear decoder is to generate a linear control count having a triangular contour, where the linear control count repeatedly, continuously counts from 0 to $(2^M-1)$ to 0.

10. The control circuit of claim 9, wherein the N-bit linear counter comprises a unidirectional counter.

11. The control circuit of claim 9, wherein N is 9 and M is 3.

12. The control circuit of claim 9, wherein the phase compensation loop comprises a digital delay locked loop (DLL).

13. The control circuit of claim 9, wherein the phase compensation loop comprises a compensation loop for data I/O (input/output) for a memory device.

14. The control circuit of claim 9, wherein the fine delay mixing subdivides each coarse phase change of the coarse control into $(2^M-1)$ fine delay phase changes.

15. A system with a memory subsystem with I/O (input/output) phase compensation, comprising:
an I/O (input/output) control circuit for a data interface between a memory controller and a memory device including:
a linear counter having an N-bit digital output;
XOR (exclusive OR) logic to perform a bitwise XOR of bit M of the N bits with each of the least significant M bits [(M−1):0] of the N bits; and
a linear decoder to decode the N bits for a phase compensation loop, wherein the linear decoder is to receive the least significant M bits from the XOR logic and generate fine delay mixing for the phase compensation loop from the least significant M bits, and wherein the linear decoder is to receive the most significant (N−M) bits [(N−1):M] and generate coarse control of a delay chain for the phase compensation loop from the most significant (N−M) bits;
wherein for the fine delay mixing, the linear decoder is to generate a linear control count having a triangular contour, where the linear control count repeatedly, continuously counts from 0 to $(2^M-1)$ to 0; and
a touchscreen display coupled to generate a display based on data accessed from the memory device.

16. The system of claim 15, wherein the N-bit linear counter comprises a unidirectional counter.

17. The system of claim 15, wherein N is 9 and M is 3.

18. The system of claim 15, wherein the phase compensation loop comprises a digital delay locked loop (DLL).

19. The system of claim 15, wherein the phase compensation loop comprises a compensation loop in the memory device.

20. The system of claim 15, wherein the fine delay mixing subdivides each coarse phase change of the coarse control into $(2^M-1)$ fine delay phase changes.

* * * * *